US006537735B1

(12) United States Patent
McCullough et al.

(10) Patent No.: US 6,537,735 B1
(45) Date of Patent: Mar. 25, 2003

(54) PATTERN-FORMING METHODS AND RADIATION SENSITIVE MATERIALS

(75) Inventors: Christopher David McCullough, Fort Collins, CO (US); Kevin Barry Ray, Ft. Collins, CO (US); Alan Stanley Victor Monk, Warrington (GB); Stuart Bayes, Leeds (GB); Mark John Spowage, Leeds (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/477,893

(22) Filed: Jan. 5, 2000

Related U.S. Application Data

(63) Continuation of application No. PCT/GB98/01953, filed on Jul. 2, 1998.

(30) Foreign Application Priority Data

| Jul. 5, 1997 | (GB) | 9714169 |
| Jul. 5, 1997 | (GB) | 9714172 |
| May 1, 1998 | (GB) | 9809346 |

(51) Int. Cl.[7] ............................................. G03F 7/30
(52) U.S. Cl. .................... 430/326; 430/322; 430/270.1; 430/281.1; 430/286.1
(58) Field of Search ................................ 430/322, 326, 430/270.1, 281.1, 286.1

(56) References Cited

U.S. PATENT DOCUMENTS

| 4,469,774 A | * | 9/1984 | Lee | 430/270 |
| 4,708,925 A | | 11/1987 | Newman | 430/270 |
| 5,118,582 A | * | 6/1992 | Ueno et al. | 430/270.1 |
| 5,227,473 A | | 7/1993 | Kawamura et al. | 534/557 |
| 5,491,046 A | | 2/1996 | DeBoer et al. | 430/302 |
| 5,512,418 A | * | 4/1996 | Ma | 430/271.1 |
| 5,763,134 A | * | 6/1998 | Busman et al. | 430/157 |
| 5,919,600 A | * | 7/1999 | Huang et al. | 430/272.1 |
| 5,948,591 A | * | 9/1999 | Vermeersch et al. | 430/270.1 |
| 5,985,514 A | * | 11/1999 | Zheng et al. | 430/270.1 |
| 6,165,691 A | * | 12/2000 | Damme et al. | 430/303 |
| 6,218,083 B1 | * | 4/2001 | McCullough et al. | 430/326 |
| 6,280,899 B1 | * | 8/2001 | Parsons et al. | 430/270.1 |
| 2001/0008748 A1 | * | 7/2001 | Busman | 430/325 |

FOREIGN PATENT DOCUMENTS

| EP | 0366590 | 5/1990 |
| EP | 0410606 | 1/1991 |
| EP | 0519591 | 12/1992 |
| EP | 0652483 | 5/1995 |
| EP | 0691575 | 1/1996 |
| EP | 0823327 | 2/1998 |
| EP | 823327 A2 | * 2/1998 | B41C/1/10 |
| WO | WO 9119227 | 12/1991 |

OTHER PUBLICATIONS

JP 7120928 A, May 12, 1995; Hattori et al. Machine translation; "Positive radiation sensitive composition and pattern forming method using that".*
V.O. Süs, "On the Nature of Exposure Products of Diazo Compounds. Transitions of Aromatic 6–Rings into 5–Rings" *Der Chemie Annalen* 556, pp. 65–84 (1944) (in German).
Templeton et al., "On the dissolution kinetics of positive photoresists: The secondary structure model," *Advances in Resist Technology and Processing IV*, SPIE vol. 711 (1987), pp. 136–147.
Koshiba et al., "Dissolution Inhibition Mechanisms of Naphthoquinone Diazides," Regional Technical Conference of the SPE, Ellenville, NY (1988), pp. 235–245.
Reiser et al., "Novolak–Diazoquinone Resists: The Imaging Systems of the Computer Chip," *Angew. Chem. Int. Ed. Engl.*, vol. 35 (1996) pp. 2429–2440.
Honda et al., "Studies of The Molecular Mechanism of Dissolution Inhibition of Positive Photoresist Based on Novolak–DNQ," *Advances in Resist Technology and Processing VII*, SPIE vol. 1262 (1990), pp. 493–500.
Reiser, *Photoreactive Polymers: The Science and Technology of Resists*, Wiley–Interscience (1988), Chapter 5.
Shih et al., "Percolation View of Novolak Dissolution: The Dissolution of Exposed Resist Films," *Macromolecules*, vol. 29 (1996), pp. 2082–2087.
Streiter, "The Chemical Behavior of Positive Working Systems," Kodak Microelectronics Seminar Proceedings (1976), pp. 116–122.
Doyle, "Advances in Printing Plate Technology," Pira Reviews of Printing (1996).
Abstract of Japanese Patent Applications Nos. 20713/96 and 302722/96 (Oct. 9, 1998).
Abstract of Japanese Patent No. 7,120,928 (May 12, 1995).
Abstract of German Patent No. 4,116,243 (Nov. 21, 1991).

* cited by examiner

*Primary Examiner*—Janet Baxter
*Assistant Examiner*—Yvette C. Thornton
(74) *Attorney, Agent, or Firm*—Faigre & Benson LLP

(57) ABSTRACT

The invention is directed to a method for producing a predetermined resist pattern on a substrate. The method includes the patternwise application of infrared radiation to a precursor which contains the substrate, having a coating thereon, wherein the coating contains a positive working composition; and the development of the pattern using a developer. The composition contains a polymeric substance having functional groups Q thereon, such that the functionalized polymeric substance has the property that it is developer insoluble prior to delivery of infrared radiation and developer soluble thereafter.

37 Claims, No Drawings

PATTERN-FORMING METHODS AND RADIATION SENSITIVE MATERIALS

CROSS-REFERENCE TO RELATED APPLICATION

This application is a continuation of international application PCT/GB98/01953, filed Jul. 2, 1998 and published in English, and claims priority from GB application 9714172.5, filed Jul. 5, 1997, from GB application 9714169.1, filed Jul. 5, 1997, and from GB application 9809346.1, filed May 1, 1998.

The present specification relates to methods of forming a desired pattern on a substrate which has coated on it a coating comprising a positive working radiation sensitive composition. The invention further relates to novel positive working radiation sensitive compositions per se, and to novel compounds used therein, and to the preparation thereof. The compositions are suitable for making lithographic printing forms or fine resist patterns of electronic parts such as printed circuits. The invention relates further to such lithographic printing forms and electronic parts per se, and to their production.

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as, paper, cloth and the like. Commonly the ink is transferred to an intermediate material called the blanket which in turn transfers the ink to the surface of the material upon which the image is to be reproduced.

New types of "waterless" lithographic printing employ only an oily ink material and preferentially ink-accepting image areas and ink-repelling non-image areas on the printing form.

A generally used type of lithographic printing form precursor (by which we mean a coated printing form prior to exposure and development) has a light sensitive coating applied to an aluminium base support. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a light source, comprising UV radiation. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed.

The photoresists used in pattern forming methods for electronic parts such as printed circuits are also classified into two types negative working and positive working. After exposure to radiation and development, the resist pattern is used as a mask for forming the patterns onto the underlying electronic elements—for example by etching an underlying copper foil. Due to the high resolution demands and the requirements of high resistance to etching techniques, positive working systems are widely used. In particular, there have in the main been used alkali developable positive working photoresists composed of alkali-soluble novolak resins as disclosed in J. C. Streiter, Kodak Microelectronics Seminar Proceedings, 1979, p. 116. The primary active component of such positive working compositions, both in the context of lithographic printing forms and electronic parts, is a naphthoquinonediazide (NQD) derivative.

The types of electronic parts whose manufacture may use a photoresist include printed wiring boards (PWBs), thick- and thin-film circuits, comprising passive elements such as resistors, capacitors and inductors; multichip devices (MDCs); and integrated circuits (ICs). These are all classified as printed circuits.

Imageable compositions may also be applied to masks. The required pattern is formed on the mask, which is then used as a screen in a later processing step, in forming a pattern on, for example, a printing or electronic part substrate.

Common to virtually all commercial applications of positive working systems over several decades have been compositions comprising alkali soluble phenolic resins and NQD derivatives. However, the role of the NQD derivatives in the compositions, in inhibiting developer resistance of the resin and increasing dissolution after exposure, is not well understood several decades after the effect was discovered by O. Süs (ref. Annalen 1944, 556, 65; German Patent 879,204).

The nature of the pure resin dissolution process has been studied in detail (Templeton et. al. SPIE Vol. 711 Advances in Resist Technology and Processing IV (1987), p. 136) and the effects of resin structure and developer components investigated. Phenolic resin dissolution is controlled by primary structural properties, such as bridging groups, substitution positions and steric effects of phenyl ring substituents, which significantly affect intra and intermolecular bonding of the resin chains, the so-called resin secondary structure. This secondary structure forms channels of hydrophilic sites through the resin which act so as to promote dissolution in the developer.

A number of complementary mechanisms have been proposed as to the nature of the solubility inhibition of the resins brought about by the use of NQD compounds, by a number of workers (Koshiba et. al., Regional Technical Conference of the SPE, Ellenville, N.Y., 1988, p. 235; Reiser et. al., Agnew. Chem. Ind. Engl. 1996, 35, p. 2428–2540; Honda et. al., SPIE Vol. 1262, Advances in Resist Technology and Processing VII, 1990, p. 493). Key mechanisms proposed have been: the presence of hydrophobic NQD in the resin matrix retarding penetration by aqueous developer; the alkali developer promoting a crosslinking, insolubilising reaction between the resin and the NQD at the interface between the resin and the developer; resin molecules being preferentially extracted from the thin interface layer into the developer causing a concentration build up of developer-insoluble NQD at the surface retarding further development; and a macromolecular structure formed between the hydrophilic sites of the resin and the polar groups of the NQD whereby the NQD acts to cap, or block, access of developer components to the hydrogen bonded secondary structure of the resin, thus preventing dissolution. The latter mechanism is generally regarded as the primary factor whilst the other mechanisms are regarded as making more minor contributions.

Also, the increased dissolution of the coatings after exposure has for decades been considered a result of the formation of an indene carboxylic acid, increasing alkali solubility. More recently Reiser et. al. have proposed that the exothermic degradation of the NQD breaks down the macromolecular structure which causes the initial inhibition. This is as a result of the loss of co-ordinating sites on the NQD and a heat pulse assisting in dispersing the structure of the resin previously imposed by the NQD.

All of the literature work on such NQD systems has concentrated on the use of simple NQD compounds in admixture with resins. However, it has been common practice for many years in the lithographic industry to utilise almost exclusively positive working systems whereby the photoactive NQD has been chemically attached to the resin itself, by esterification of the resin with an NQD sulphonyl chloride, to make a so-called NQD resin ester. These systems were developed primarily as a solution to crystallisation and/or migration of simple NQD compounds within coated films (Reiser, "Photoreactive Polymers", Wiley-Interscience, 1988). These NQD resin esters have also been used in the electronics industry to restrict migration of NQD in multi-layer resist systems.

In such NQD resin esters solubility inhibition in the selected developer is observed relative to the unesterified parent resin. However, clearly the same theories proposed for the interactions in admixture systems are not all directly applicable to these resin ester systems. No literature has been published setting out new or modified theories relating to these systems.

The dominance of the NQD moiety in positive working systems is due to its multifunctional nature, providing developer inhibition of the resins prior to exposure to UV radiation, UV absorbance, and, when exposed to UV radiation, heat, and decomposition products including carboxylic acid groups, such that solubility inhibition is reversed on exposure to UV radiation. However this multifunctional nature has brought restrictions in the performance possible from systems relying heavily on this single component, whether as admixture systems or resin ester systems.

In order to increase sensitivity, the level of NQD is increased. However, this also increases developer resistance and so works against the sensitivity benefit. It has not been possible to photosensitise the NQD moiety to break this constraint and so NQD systems are all designed around this compromise of sensitivity and developer resistance. In addition the systems are limited to UV sources due to the perceived inability to photosensitise to other wavelengths.

As demands on the performance of UV sensitive positive working coatings have increased so NQD technology has become limiting. In addition, digital and laser imaging technology is making new demands on coatings in both lithography and electronic parts imaging.

There have been proposed methods to improve light sensitivity using light-sensitive systems which are catalytically activated, using the known principle that a photolytically generated acid can be used to cause a second reaction which makes the composition in exposed areas soluble. However, such systems have problems such as storage stability and changes in sensitivity with time.

We have found a method of producing resins whereby resin dissolution inhibition is controlled by modifications directly to the primary resin structure, other than by substitution with NQD sulphonate esters, wherein the inhibition can be reversed by the application of heat. Furthermore, positive working compositions comprising such resins are described which allow greater independent control of the dissolution inhibition and the composition sensitivity. Methods to increase the range of wavelength sensitivities have also been identified. Such methods and materials do not exhibit disadvantages of prior art positive working systems.

We regard these findings as most surprising, going as they do against a background of several decades of NQD derivatives being the dominant compounds in controlling developer solubility of typical resins in positive working systems, and going also against explanations of the mechanisms at work, in which explanations the breakdown chemistry of the NQD compounds is of paramount importance.

In accordance with a first aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not comprise a naphthoquinone diazide (NQD) or a benzoquinone diazide (BQD) group.

In accordance with a second aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not contain a diazide group.

In accordance with a third aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups are not chemically decomposed on exposure to said radiation. By "not chemically decomposed" we mean that covalent bonds are not broken by exposure to said radiation to any extent which is significant in the effectiveness of the method.

In accordance with a fourth aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q do not comprise acid groups or acid generating groups, in each case protected by labile protective groups removed on exposure to said radiation.

In accordance with a fifth aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that the functional groups Q are not additionally primarily responsible for the absorption of said radiation.

It is believed that the difference in the developer solubility between the functionalised polymeric substance compared with the corresponding unfunctionalised polymeric substance may involve several mechanisms but that acid generation on exposure to said radiation is not significant, in contrast to existing systems. It is further believed that one important mechanism is a hydrogen bonding interaction between the functional groups Q and other groups of the polymeric, substance. Intramolecular hydrogen bonding is likely to be more important but intermolecular hydrogen bonding may also be important, and may even be more important in some systems. Suitably, therefore, the functionalised polymeric stance is such that there is hydrogen bonding between the said functional groups Q and other groups of the polymeric substance, in addition to covalent bonding of the functional groups Q, to the polymeric substance.

In accordance with a sixth aspect of the present invention there is provided a method for producing a predetermined resist pattern on a substrate, the method comprising: the patternwise application of radiation to a precursor which comprises the substrate, having a coating thereon, the coating comprising a positive working composition; and the development of the pattern using a developer; wherein the said composition comprises a polymeric substance having functional groups Q thereon, such that the functionalised polymeric substance has the property that it is developer insoluble prior to delivery of radiation and developer soluble thereafter, characterised in that there is hydrogen bonding between said functional groups Q and other groups of the same molecule or other molecule(s) of the polymeric substance.

In the practice of this invention it is preferred that composition components are selected, which do not produce a gas upon exposure to radiation.

Preferably the corresponding unfunctionalised polymeric substance is significantly more soluble in a selected developer, than the corresponding polymeric substance functionalised by the groups Q. Preferably, in practical terms it may be regarded as a soluble polymeric substance.

It is believed that heat breaks down the hydrogen bonding with no primary structure decomposition i.e. no covalent bond breaking is believed to be required for the effectiveness of the method.

Although the invention is not limited in respect of the manner in which the groups Q are bonded to the polymeric substance, preferably a said corresponding unfunctionalised polymeric substance has hydroxy groups, which are functionalised by the groups Q. Preferably the, said functionalised polymeric substance retains hydroxy groups. That is, the functional groups Q may covalently bond to the polymeric substance through reaction with hydroxy groups thereof, but preferably not all of the hydroxy groups are thereby reacted.

Preferably the ratio of functional groups Q in the functionalised polymeric substance to hydroxy groups in the corresponding unfunctionalised polymeric substance is in the range 1:100 to 1:2. More preferably the said functional group ratio is in the range 1:50 to 1:3. Most preferably the said functional group ratio is in the range 1:20 to 1:6.

Examples of suitable polymeric substances may be selected from phenolic resins; polymers of styrenes, for example 4-hydroxystyrene, 3-methyl-4-hydroxystyrene and 4-methoxystyrene, acrylic acids, for example, methacrylic acid and acrylic acid, maleiimide, maleic acid and maleic acid anhydride; in each case, as homopolymers, co-polymers or terpolymers.

Preferably the polymeric substance is not a poly(vinyl phenol) homopolymer.

Instead of hydroxy groups the unfunctionalised polymeric substance may comprise thiol groups which can likewise be functionalised. However hydroxyl groups are preferred for functionalisation.

Novolak resins are useful in this invention, suitably being condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane, and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare those phenolic resins generally known as novolacs which are thermoplastic in character. Higher aldehyde:phenol ratios of more then 1:1 to 3:1, and a basic catalyst would give rise to a class of phenolic resins known as resoles, and these are characterised by their ability to be thermally hardened at elevated temperatures.

Most preferably the said unfunctionalised polymeric substance is a phenolic resin. Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Examples of suitable novolak resins have the following general structure

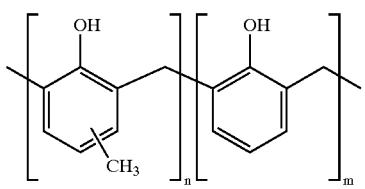

The functional groups Q suitably enable hydrogen bonding with moieties of the functionalised polymer. Suitable moieties Q known to favour hydrogen bonding and which may be comprised by the functional groups Q, may include amino, monoalkylamino, dialkylamino, amido, monoalkylamido, dialkylamido, chloro, fluoro, carbonyl, sulphinyl and sulphonyl moieties.

Preferably the functional groups Q are bonded to the polymeric substance by an esterification reaction to form a resin ester.

A preferred composition of the invention may be defined by the formula $R(Q)_n$ where R is the polymer chain of the polymeric substance and $(Q)_n$ represents functional groups bonded thereto, wherein Q represents a moiety which can hydrogen bond to the polymer chain R of the same molecule or an adjacent molecule or molecules and n represents a plural integer.

Preferably Q represents a group of formula —T—Z where T represents a moiety which can hydrogen bond to the polymer chain R of the same molecule or an adjacent molecule or molecules and Z represents a further moiety which may or may not hydrogen bond to the polymer chain R. In such cases the polymer chain R requires other substituents which can participate in the hydrogen bonding, for example thiol or, most preferably, hydroxy groups.

Suitably Q represents a group of formula —O—$T^1$—Z where $T^1$ is a moiety which can hydrogen bond to the polymer chain R of the same molecule or an adjacent molecule or molecules. Suitably $T^1$ represents a carbonyl group, a sulphinyl group or a sulphonyl group. Preferably it represents a carbonyl or, especially, a sulphonyl group.

One group Q may be covalently bonded to the polymeric resin at more than one site thereof, to form a cyclic structure. For example Q may be defined as being a group of formula —O—X(Z)—O— where X represents a linking moiety and Z represents a said further moiety. This may occur, for example, in certain phosphorus-modified novolak resins, produced by reaction with phosphoric acids or phosphorus oxyhalides.

Preferably a said linking moiety X can hydrogen bond to the polymer chain R of the same molecule or an adjacent molecule or molecules.

In such embodiments, a said linking moiety X may suitably be a group of formula —P(O)—.

A moiety Z may for example be an optionally substituted alkyl, alkenyl, alkynyl, cycloalkyl, aryl, heteroaryl, non-aromatic heterocyclic, aralkyl or heteroaralkyl group.

Unless otherwise indicated in this specification, the following definitions apply in this specification:

an alkyl, alkenyl or alkynyl group may be linear or branched and may contain up to 10, preferably up to 8, carbon atoms, suitable examples being methyl, ethyl, propyl, butyl, pentyl, hexyl, heptyl, octyl, vinyl, allyl and propargyl. Unbranched groups may be preferred but branched groups may be employed.

a cycloalkyl group may contain from 3 to 12, preferably 3 to 8, carbon atoms, and is suitably cyclopropyl or cyclohexyl, but could be a fused/bridged structure such as 10-camphoryl.

the alkylene portion of an aralkyl or heteroaralkyl group is suitably a $C_{1-4}$ alkylene group, especially methylene (—$CH_2$—).

aryl groups are preferably naphthyl or phenyl.

aralkyl groups are preferably ($C_{1-4}$ alkyl) phenyl or ($C_{1-4}$ alkyl) naphthyl, especially benzyl or naphthylmethyl.

heteroaromatic or heterocyclic groups suitably are respectively aromatic or non-aromatic groups, containing within the carbon atom ring or rings 1 to 4 hetero atoms independently selected from oxygen, sulphur and nitrogen. Fused heteroaromatic or heterocyclic groups may be employed but preferably the group is a single ring having 5 or 6 atoms in the ring. Preferred is pyrazolyl and, especially, thienyl.

in relation to optional substituents of the aliphatic moieties set out above, namely alkyl, cycloalkyl, alkenyl, alkynyl and heterocyclic (non-aromatic) groups and of the alkylene portions of the aralkyl and heteroaralkyl groups, specific examples of such substituents include halo, nitro, cyano, carbonyl, hydroxy, thiol, amino, mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$alkyl)amido (—$CONR^1R^2$), $C_{1-4}$ alkoxy, $C_{1-4}$ haloalkoxy, ($C_{1-4}$alkyl)carbonylamino ($R^3C(O)NH$—, for example acetamido), —COOH, ($C_{1-4}$ alkyl)carbonyl and ($C_{1-4}$ alkoxy)carbonyl groups. Good results have however, been obtained using aliphatic moieties which are unsubstituted.

in relation to optional substituents of an aryl or heteroaryl moiety set out above, including of an aralkyl or heteroaralkyl group, optional substituents include halo, nitro, cyano, hydroxy, thiol, amino mono-$C_{1-4}$ alkylamino, di-$C_{1-4}$ alkylamino, amido (—$CONH_2$), mono-($C_{1-4}$ alkyl)amido (—$CONHR^1$), di-($C_{1-4}$ alkyl) amido ($CONR^1R^2$), $C_{2-4}$ alkenyl, Con alkyl, $C_{1-4}$ alkoxy, ($C_{1-4}$ alkyl)carbonylamino ($R^3C(O)NH$—, for example acetamido), —COOH, ($C_{1-4}$ alkyl)carbonyl and ($C_{1-4}$ alkoxy)carbonyl. When there is substitution of said aryl or heteroaryl groups 1 to 3 substituents may suitably be employed. Alkyl, alkylamino, alkylamido, alkylcarbonylamino, alkenyl, alkoxy, alkylcarbonyl and alkoxycarbonyl moieties carried by said aryl or heteroaryl groups are preferably unsubstituted but may be substituted by substituents selected from the list given above for aliphatic moieties.

a halo moiety is preferably a fluoro, chloro or bromo group.

Preferably the moiety Z is an optionally substituted aryl, heteroaryl or alkyl group. An especially preferred aryl group is a phenyl or naphthyl group optionally substituted by 1–3 moieties independently selected from hydroxy, halo, $C_{1-4}$ alkyl (especially methyl), $C_{1-4}$ haloalkyl (especially $CF_3$), $C_{1-4}$ alkoxy (especially methoxy), amino, mono-($C_{1-4}$ alkyl) amino (especially methylamino), and di-($C_{1-4}$ alkyl)amino (especially dimethylamino). An especially preferred aryl group is a naphthyl group, a dansyl group, a phenyl group or a 4-methylphenyl group. An especially preferred optionally substituted alkyl group is a $C_{2-8}$ alkyl group, especially an n-$C_{3-6}$ alkyl group.

An especially preferred composition of the invention comprises a phenolic resin, to hydroxy groups of which moieties selected from —O—$SO_2$-tolyl, —O-dansyl, —O—$SO_2$-thienyl, or —O—$SO_2$-naphthyl and —O—CO—Ph are bonded.

It should be noted that the invention is characterised in certain aspects by the presence, in the composition, of functional groups Q which do not contain an NQD or BQD group. However the presence of diazide groups additional to the functional groups Q is not excluded from the above definitions of the invention.

Also, the presence, in the composition, of simple diazide compounds, for example NQD or BQD compounds, is not excluded from the above definitions of the invention.

Thus, one composition useful in the method of the invention comprises a phenolic resin having groups Q (preferably hydroxy groups to which moieties selected from —O—$SO_2$-tolyl, —O-dansyl, —O—$SO_2$-thienyl, —O—$SO_2$-naphthyl and —O—CO—Ph are bonded) in admixture with simple diazide-containing compounds.

Another composition useful in the method of the invention comprises a phenolic resin, to hydroxy groups of which sulphonyl diazide moieties are bonded, and to further hydroxy groups of which moieties Q, preferably selected from —O—$SO_2$-tolyl, —O-dansyl, —O—$SO_2$-thienyl, —O—$SO_2$-naphthyl and —O—CO—Ph, are bonded.

Compositions containing resins carrying groups Q and also containing diazide groups may be novel and constitute a further aspect of the present invention. Furthermore resins bearing diazide groups and groups Q as separate functional groups, examples being described in the previous paragraph, are novel and constitute a further aspect of the present invention, along with methods for their preparation, suitably by co-esterification.

When diazide groups are used in this invention they preferably comprise diazo groups =$N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-napthoquinonediazide (NQD) moieties.

A BQD moiety may, for example, comprise the 1,4- or, preferably 1,2-benzoquinonediazide moiety.

An NQD moiety may, for example, comprise the 1,4-, 2,1- or, most preferably, the 1,2-naphthoquinone diazide moiety.

Generally, NQD moieties are preferred to BQD moieties in the practice of the invention.

The most preferred diazide moiety for use in the practice of the present invention is the 1,2-naphthoquinonediazide moiety.

In addition to the polymeric substance, or substances, as defined above, the composition may contain an additional polymeric substance, or substances. Such may be regarded as "inactive", in having a given level of inherent developer solubility and not being functionalised to alter that inherent developer solubility, or may be regarded as an additional "active" polymeric substance, or substances, including for example an NQD resin ester. In such a composition having a blend of polymeric substances it should be noted that the polymeric substance(s) of the invention can be present in a lower amount, by weight, than the other polymeric substance(s). Suitably the polymeric substance of the invention may be present in an amount of at least 10%, preferably at least 20% by total weight of the polymeric substances present in the composition.

It should be noted that the quantitative definitions presented above are typical ranges, and that the precise selection will depend on the particular circumstances. For example the selection of highly effective functional groups Q may mean that a blend of polymeric substances may be used, with the polymeric substance(s) of the invention in relatively low proportion; and/or that the aforesaid functional group ratio may be lower than if a less effective functional group had been selected. The pattern-forming conditions selected and the developer to be used, will also be of relevance. The selection of a higher functional group ratio may mean that a lesser amount of polymeric substance(s) of the invention in a blend thereof may be employed; an inherently more soluble unfunctionalised polymeric substance may mean that a weaker developer can be used (to environmental advantage), or a lesser delivery of radiation, or a lower functional group ratio, or a faster processing speed either in terms of radiation delivery or development time, or both. There are thus several composition, imaging and developing variables which can be employed to advantage for a given application.

We will now describe the formation of a desired pattern on a substrate, by means of a method as defined above. The substrate could, for example, be a coated lithographic printing form precursor, or a coated electronic substrate. We believe that the composition should preferably be such that it is patternwise solubilized by heat. In broad terms there are three ways in which heat can be patternwise delivered to the composition, in use. These are:

the direct delivery of heat by a heated body, by conduction. For example the composition may be contacted by a heat stylus; or the reverse face of a support surface onto which the composition has been coated may be contacted by a heat stylus.

the use of incident electromagnetic radiation to expose the composition, the electromagnetic radiation being converted to heat, either directly or by a chemical reaction undergone by a component of the composition. The electromagnetic radiation could for example be infrared, UV or visible radiation. Suitably the wavelength entirely or predominantly exceeds 500 nm. Preferably it entirely or predominantly exceeds 600 nm. More preferably it entirely or predominantly exceeds 700 nm. Most preferably it entirely or predominantly exceeds 800 nm. Preferably it is of wavelength entirely or predominantly below 1400 nm. More preferably it is of wavelength entirely or predominantly below 1200 nm. Most preferably it is of wavelength entirely or predominantly below 1100 nm. Thus, suitably it is of wavelength entirely or predominantly in the range 600 to 1400 nm, more preferably 700 to 1200 nm, most preferably 800 to 1100 nm.

the use of charged-particle radiation, for example electron beam radiation. Clearly, at the fundamental level the charged-particle mode and the electromagnetic mode are convergent; but the distinction is clear at the practical level.

In order to increase the sensitivity of the heat-sensitive compositions of the present invention it is beneficial in embodiments using electromagnetic radiation to include an additional component, namely a radiation absorbing compound capable of absorbing the incident electromagnetic radiation and converting it to heat (hereinafter called a "radiation absorbing compound"). It may also be desirable to include such a compound in a method using charged particle radiation.

Methods of imagewise exposure of compositions as defined above constitute further aspects of the present invention.

In compositions intended to require infra-red radiation for imagewise exposure the composition may be exposed directly by means of a laser. Preferably the laser emits radiation at above 600 nm, more preferably at above 700 nm, most preferably at above 800 nm. In such compositions a suitable radiation absorbing compound, to convert the infra-red radiation to heat, may usefully be a black body radiation absorber, such as carbon black or graphite. It may be a commercially available pigment such as Heliogen Green as supplied by BASF or Nigrosine Base NGl as supplied by NH Laboratories Inc or Milori Blue (C.I. Pigment Blue 27) as supplied by Aldrich.

In preferred methods of the invention the coated plate is imagewise exposed directly by a laser. Most preferably the laser emits radiation at a wavelength above 600 nm and the radiation absorbing compound is usefully an infra-red absorbing dye.

Examples of lasers which can be used in the method of the present invention include semiconductor diode lasers emitting at between 500 and 1400 nm, preferably between 600 nm and 1200 nm, especially between 600 and 1100 nm. An example is the Nd YAG laser which emits at 1064 nm, but any laser of sufficient imaging power and whose radiation is absorbed by the composition, can be used.

Preferably the infra-red absorbing compound is one whose absorption spectrum is significant at the wavelength output of the laser which is to be used in the method of the present invention. Usefully it may be an organic pigment or dye such as phthalocyanine pigment. Alternatively it may be a dye or pigment of the squarylium, merocyanine, cyanine, indolizine, pyrylium or metal dithioline classes.

In compositions intended to require infra-red radiation for patternwise exposure it is preferred that their developer solubility is not increased by incident UV or visible radiation, so making handling of the compositions straightforward. Preferably such compositions do not comprise any UV or visible light sensitive components. However UV or visible light sensitive components which are not activated by UV or visible light due to the presence of other components, such as UV or visible light absorbing dyes or a UV or visible light absorbing topmost layer, may be present.

In compositions intended to require UV radiation for patternwise exposure the composition may contain any radiation absorbing compound able to convert incident UV radiation to heat. Suitable radiation absorbing compounds include black body radiation absorbers, for example carbon black or graphite, and latent Bronsted acids, including onium salts and haloalkyl-substituted S-triazines, as described in U.S. Pat. Nos. 5,491,046 and 4,708,925. The relevant lists of UV absorbing compounds in these patents are incorporated herein by reference. Diazide derivatives may also be employed, within the definitions of the invention given herein. It should be noted that the function of such compounds when present in the composition will not be primarily to bring about the radiation-induced solubility change; it is primarily the functional groups Q of the polymeric substance which do that. Rather, it will be primarily to absorb radiation, to produce the heat believed to be necessary for the effectiveness of the method. That is, in the absence of the functional groups Q the UV absorbing compounds would absorb UV and release heat but this would not of itself be sufficient to bring about a solubility change, or at least a solubility change of any useful level. This is a matter of selecting suitable UV absorbing compounds and including them in suitable amounts. If necessary simple tests may be devised to check the function of the UV absorbing compounds.

Whilst the presence of a UV absorbing compound may sometimes unavoidably make some contribution to the control of developer solubility it is desirable that this should be minimised—its presence in compositions of the invention is primarily to deliver heat on exposure to UV radiation and the best control of the functioning of the composition is achieved by separating the chemistries of the radiation absorption and the developer solubility change.

When present in compositions of the invention a UV absorbing compound, including a diazide derivative, is preferably present as a simple compound, not covalently bonded to the active polymer; whereas the functional groups Q are covalently bonded to the active polymeric substance.

In compositions intended to require visible radiation for imagewise exposure the compositions may suitably contain a black body absorber, for example carbon black or graphite, or a triazine compound "tuned" to absorb visible light.

We have now found that pigments are particularly effective in the present invention. Whilst we expected them to work we did not expect that they would be as effective as IR dyes. To our surprise we have found them to be extremely effective and to offer some practical and commercial advantages over IR dyes. The pigment formulations retain good operating speed, no discernable tendency to cause coating retention in the pits of the substrate, are more tolerant of different wavelengths during exposure. Further most pigments are considerably less expensive than most IR dyes.

Suitably the radiation absorbing compound, when present, constitutes at least 0.25%, preferably at least 0.5%, more preferably at least 1%, most preferably at least 2%, of the total weight of the composition. Suitably the radiation absorbing compound, when present, constitutes preferably up to 25%, more preferably up to 20%, and most preferably up to 15%, of the total weight of the composition. Thus a preferred weight range for the radiation absorbing compound may be expressed as 2–15% of the total weight of the composition. More specifically, in the case of dyes the range may preferably be 0.25–15% of the total weight of the composition, preferably 1–6%, whilst in the case of pigments the range may preferably be 1–25%, preferably 2–15%. For pigments, 5–15% may be especially suitable. In each case the figures given are as a percentage of the total weight of the dried composition. There may be more than one radiation absorbing compound. References herein to the proportion of such compound(s) are to their total content.

Pigments are generally insoluble in the compositions and so comprise particles therein. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they do not have any marked effect on the solubility of the unheated composition, in the developer. In contrast dyes are generally soluble in the compositions. Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Frequently they have a marked effect on the solubility of the unheated composition in the developer, typically making it much less soluble.

The compositions used in the invention may contain other ingredients such as stabilising additives, inert colorants, and additional inert polymeric binders as are present in many positive working compositions.

The major proportion of the composition is preferably constituted by polymeric substance(s), including the "active" polymeric substance(s) and, when present, "inactive" polymeric substance(s). Preferably a minor proportion of the composition is constituted by additional components, when present at all.

A major proportion as defined herein is suitably at least 50%, preferably at least 65%, most preferably at least 80%, of the total weight of the composition.

A minor proportion as defined herein is suitably less than 50%, preferably up to 20%, most preferably up to 15%, of the total weight of the composition.

In one preferred embodiment of the invention an additional layer comprising a radiation absorbing compound can be used. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapour deposited layers. Techniques for the formation and use of such films are well known in the art, for example as described in EP 0,652,483.

The preferred substrates in the present invention in the context of lithography are those that are hydrophilic as the uniform coating or which can be treated to provide a hydrophilic surface, for example by use of a hydrophilic layer. However the invention is also applicable to waterless lithography.

The base which can be used as the support may be a semiconductor or, preferably, a conductor in the context of electronic circuitry, and in the context of lithography may be an aluminium plate which has undergone the usual anodic, graining and post-anodic treatments well known in the lithographic art for enabling a radiation sensitive composition to be coated thereon and for the surface of the support to function as a printing background. Another base material which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used.

In the specification when we state that a composition is developer soluble we mean that it is soluble in a selected developer, to an extent useful in a lithographic printing form development process or an electronic part photoresist development process. When we state that a composition is developer insoluble we mean that it is not soluble in the selected developer, to an extent useful in a lithographic printing form development process or an electronic part photoresist development process.

The composition is preferably used as a coating on a precursor for a lithographic printing form or an electronic part.

Additionally the composition may be used as a coating on a mask. The mask substrate itself is suitably a plastics film.

Masks are used in some imaging methods, whether in the context of printing or circuit board substrates, with the required resist pattern being formed on the mask, which is then used as a screen in a later processing step. One example of such a process is the flexographic process, as described in "Advances in Printing Plate Technology" by S. Doyle, ISBN 1858020875. Some masks may require the removal of only a proportion of the full depth of the composition where exposed, rather than the full depth thereof.

The heat sensitive compositions described herein may be coated onto a film, and heat-imaged, and developed, to provide a mask. The mask may be imaged to leave the composition thereon in different depths at different locations, after development. Such a mask may then usefully be applied over a printing substrate and flood exposed, for example using a UV light source.

According to a further aspect of the present invention there is provided a positive working precursor as defined above in relation to any method of the invention.

The precursor may suitably be a precursor for a printing form.

The precursor may suitably be a precursor for an electronic part.

The precursor may suitably be a precursor for a mask to be used as a screen in a later flood exposure step, carried out to image a separate part, for example a printing form substrate or electronic part substrate.

Thus in preferred embodiments of the present invention a positive working lithographic printing form or electronic part or mask is obtained after patternwise irradiation and processing of such a precursor. The developer solubility of the coated composition comprising the functionalised polymeric substance is much reduced with respect to the solubility of the corresponding unfunctionalised polymeric substance alone. On subsequent patternwise exposure the exposed areas of the composition are rendered more soluble in the developer. Therefore on imagewise exposure there is a change in the solubility differential of the unexposed composition and of the exposed composition. Thus in the exposed areas the composition is dissolved, to form the pattern.

The coated printing form or electronic part or mask precursors of the invention may be heat imaged indirectly by exposure to a short duration of high intensity radiation transmitted or reflected from the background areas of a graphic original located in contact with the recording material.

In another aspect of the invention the coated printing form or electronic circuit or mask precursors may be patternwise heated using a heated body. For example the reverse face of a support surface, onto the front face of which the heat sensitive composition is coated, may be contacted by a heat stylus. Alternatively the heat sensitive composition itself maybe contacted by a heat stylus.

In another aspect of the invention the coated printing form or electronic circuit or mask precursors may be exposed by means of suitable radiation to heat the coating patternwise.

The developer composition is dependent on the nature of the polymeric substance, but is preferably an aqueous composition. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

In accordance with a further aspect of the present invention there is provided a printing form or electronic part or mask, having a pattern formed in the said coating thereof by means of any method of the present invention.

In accordance with a further aspect of the present invention there is provided a positive working composition, as defined above, useful in any method of the invention.

In accordance with a further aspect of the present invention there is provided a said functionalised polymeric substance, per se.

In accordance with a further aspect of a functionalised polymeric substance, being a resin ester of the general formula R(Q)$_n$ where R is the polymer chain of the polymeric substance, and Q represents a group of formula —O—T$^1$—Z where T$^1$ represents a carbonyl group, a sulphinyl group or a sulphonyl group, or a group of the formula —O—X(Z)—O— where X represents a group —P(O)—; wherein Z represents an alkyl, alkenyl, alkynyl, cycloalkyl, aryl, heteroaryl, non-aromatic heterocyclic, aralkyl or heteroaralkyl group, each such group being optionally substituted; wherein optional substituents of the aryl and heteroaryl groups, and of the aryl and heteroaryl parts of the aralkyl or heteroaralkyl groups, are selected from halo, nitro, cyano, hydroxy, thiol, amino, optionally substituted mono-$C_{1-4}$ alkylamino, optionally substituted di-$C_{1-4}$ alkylamino, amido, optionally substituted mono-($C_{1-4}$ alkyl)amido, optionally substituted di-($C_{1-4}$ alkyl)amido, optionally substituted $C_{2-4}$ alkenyl, optionally substituted $C_{1-4}$ alkyl, optionally substituted $C_{1-4}$ alkoxy, ($C_{1-4}$ alkyl)carbonylamino, —COOH, optionally substituted ($C_{1-4}$ alkyl)carbonyl and optionally substituted ($C_{1-4}$ alkoxy) carbonyl groups; and wherein optional substituents of the alkyl, alkenyl, alkynyl, cycloalkyl and non-aromatic heterocyclic groups, and of the alkyl parts of the aralkyl and heteroaralkyl groups, and of the alkyl, alkoxy, alkylamino, alkylamido, alkylcarbonyl, alkoxycarbonyl, alkylcarbonylamino and alkenyl moieties optionally substituting said aryl or heteroaryl moieties are selected from halo, nitro, cyano, carbonyl, hydroxy, thiol, amino, mono-$C_{1-4}$ alkylamino, disco, alkylamino, amido, mono-($C_{1-4}$, alkyl)amido, di-($C_{1-4}$ alkyl)amido, $C_{1-4}$ alkoxy, —COOH, ($C_{1-4}$ alkyl) carbonylamino, ($C_{1-4}$ alkyl)carbonyl and ($C_{1-4}$ alkoxyl) carbonyl groups.

In accordance with a further aspect of the present invention there is provided a process for the preparation of a said functionalised polymeric substance, comprising functionalisation of the corresponding unfunctionalised polymeric substance, or functionalisation of a corresponding monomer or prepolymer, then polymerisation thereof.

Simple tests, tests 1 to 5 below, may be carried out to determine if the composition comprising the polymeric substance, the selected developer and hydrophilic support, are together likely to be suitable for use in the present invention, in the context of lithographic printing. For simplicity these tests involve the direct delivery of heat, whereas the delivery of heat to the composition in use may be direct or via conversion of incident electromagnetic or charged-particle beam radiation, as described above.

Test 1

The composition comprising the said corresponding unfunctionalised polymeric substance is coated on a hydrophilic support and dried. Then the surface is inked-up. If a uniform inked coating is obtained then the composition is ink-accepting when laid down as a coating.

Test 2 (Optional)

The support coated with the composition comprising the said corresponding unfunctionalised polymeric substance is processed in the selected developer for a suitable time which may be determined by trial and error but will typically be between 15 to 120 seconds, at room temperature, and then rinsed, dried and inked-up. If no ink surface is obtained then the composition has dissolved in the developer.

Test 3

The composition comprising the functionalised polymeric substance is coated on the support, dried and inked-up. If a uniform inked coating is obtained then the composition is ink-accepting when laid down as a coating.

Test 4

The support coated with the composition comprising the functionalised polymeric substance is processed in a the selected developer for a suitable time which may be determined by trial and error but will typically be between 15 to 120 seconds, at room temperature, and then rinsed, dried and inked-up. If a uniform inked coating is obtained then the composition is insoluble in the developer.

Test 5

The support coated with the composition comprising the functionalised polymeric substance is heated, for example in an oven or by contact with a heated body, such that the composition reaches a suitable temperature for an appropriate period of time. Then it is processed in the selected developer for an appropriate period of time at room temperature. The surface is then dried and inked-up. If no ink surface is obtained then the heated composition has dissolved in the developer. The temperature and time for the heating stage depend on the components selected for the composition and on their proportion. Simple trial and error experiments may be undertaken to determine suitable conditions. Initial failures may therefore not be determinative but if there is a persistent inability to obtain a pass result despite reasonable efforts, the conclusion must be that the composition has failed this test. Preferably a typical composition, for example a functionalised phenolic resin, may be heated such that the composition reaches a temperature of 50° C. to 180° C. for 5 to 30 seconds. Then it is processed in the selected developer for a suitable period of time which may be determined by trial and error but will typically be 15 to 120 seconds, at room temperature. Most preferably, the functionalised polymeric substance is heated such that the composition reaches a temperature of 100° C. to 160° C. for 5 to 20 seconds. Then it is processed in the selected developer typically for 15 to 120 seconds at room temperature.

If the composition can pass these tests then it is suitable for use on a lithographic printing plate in the method of the present invention provided of course that in embodiments involving the conversion of electromagnetic or charged-particle beam radiation to heat, the appropriate radiation therefor is delivered, having regard to any radiation absorbing compound which is present. Equally, the composition is likely to fulfil the requirements for a photoresist for electronic circuits or masks. However, the aspects of the above tests which determine ink-accepting properties are irrelevant in this context and can be dispensed with.

Any feature of any aspect of the present invention or embodiment described herein may be combined with any feature of any other aspect of the invention or embodiment described herein.

In this specification we put forward some of our ideas as to the mechanisms at work in the practice of the invention, and to an extent this has influenced the ways in which we define this invention. However we would not wish our patent protection to be bound by any particular ideas of this nature. The key fact is that we have derived new methods, compounds and compositions which our experimental work has shown to be effective, and this fact stands even if our ideas as to the mechanisms change as more work is done.

The following Examples more particularly serve to illustrate the various aspects of the present invention described hereinabove.

Starting Materials

The following products are referred to hereinafter.

LB6564—a 1:1 phenol/cresol novolak resin supplied by Bakelite, UK.
LB744—a cresol novolak resin supplied by Bakelite.
LG724—a phenol novolak resin supplied by Bakelite.
PHS-4—a polyhydroxystyrene resin supplied by Maruzen. America Inc, NY, under the trade name Meruka Lyncur-M(S-1).
PD-390A—a meta cresol novolak resin supplied by Borden Chemicals, Southampton, UK.
SD-423A—an ortho cresol novolak resin supplied by Borden Chemicals.
SD-443A—a para cresol novolak resin supplied by Borden Chemicals.
SD-444A—a 43:57 meta:ortho cresol novolak resin supplied by Borden Chemicals.
PD-494A—a 53:47 meta:ortho cresol novolak resin supplied by Borden Chemicals.
214-NQD chloride—the compound

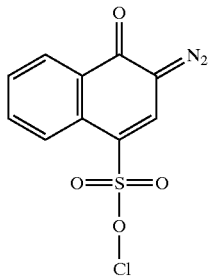

supplied by A. H. Marks of Bradford, UK.
NW6564—the resultant resin when LB6564 (100 g) was reacted with 214-NQD chloride (18 g), by the process outlined hereafter.
NW744—the resultant resin when LB744 (100 g) was reacted with 214-NQD chloride (18 g) by the process outlined hereafter.
HSL-1—a blend of LB744 and LB6564, 60:40, w:w.
HSL-2—blend of NW6564 and NW744, 50:50, w:w.
Dye A—KF654B PINA as supplied by Riedel de Haan, UK, Middlesex, UK, believed to have the structure:

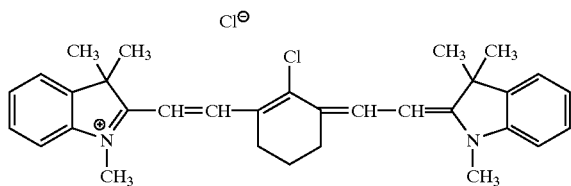

PC-A—the photoactive compound 2,4-dihydroxybenzophenone bis(6-diazo-5,6-dihydro-5-oxo-1-naphthalene sulphonate) supplied by A. H. Marks, Bradford, U.K., having the structure:

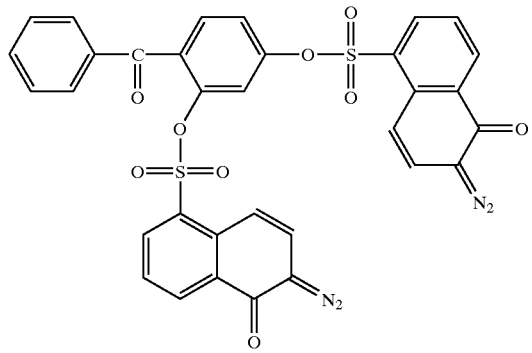

Dye B—the victoria pure blue BO as supplied by Aldrich. Chemical Company, Dorset, UK, having the structure:

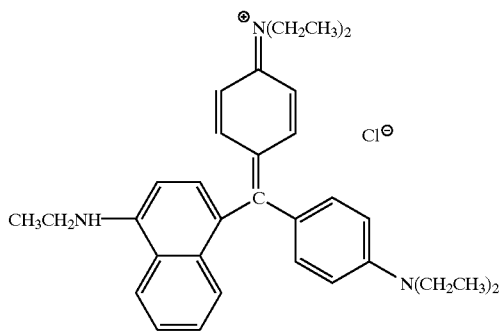

AG-A—the acid generator compound supplied by PCAS, Longjumeau, France, having the structure:

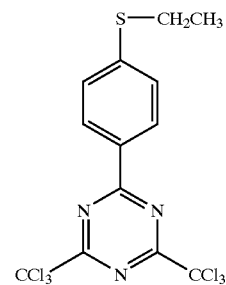

PC-B—the photoactive compound supplied by PCAS, having the structure:

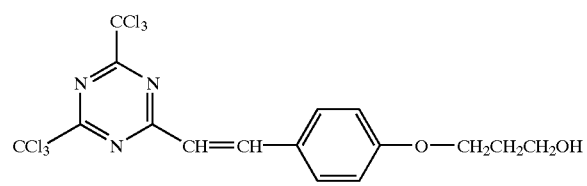

Mon-C—Monazoline C, a cocyl imidazoline IR absorbing dye supplied by Mona Industries Inc., New Jersey, USA, having the following formula

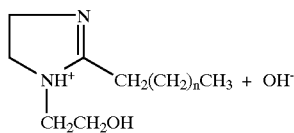

FW2—a channel type carbon black obtained from Degussa, Macclesfield, UK.

Developer D1—14% wt sodium metasilicate pentahydrate in water.

Developer D2—7% wt sodium metasilicate pentahydrate in water.

Developer D3—3.5% wt sodium metasilicate pentahydrate in water.

Developer D4—Kalle EP260 developer.

Developer D5—potassium hydroxide (0.15 M) in water.

Developer D6—tetramethylammonium hydroxide (0.15M) in water.

Developer D7—Lithium hydroxide (0.5M) in water.

Developer D8—Sodium hydroxide (0.5M) in water.

Developer D9—Potassium hydroxide (0.5M) in water.

Creo Trendsetter 3244—a commercially available plate setter, using Procomm Plus Software, operating at a wavelength of 830 nm at powers of up to 8 W and supplied by Creo Products Inc., Burnaby, Canada.

Unless otherwise stated the chemicals used were as supplied by Aldrich Chemical Company, Dorset, UK.

The resins were modified by simple reaction with respective acid chlorides. An example follows.

1. Dissolve 25.0 g of the desired phenolic resin in 61.8 g of 2-methoxy ethanol.
2. Immerse a three-necked 500 ml round-bottomed flask in a water bath placed on a hot plate/stirrer. Attach a stirrer gland, stirring rod and a thermometer to the flask.
3. Place the resin solution into the flask and begin rapid stirring.
4. Slowly add 25.6 g of distilled water drop-wise keeping precipitation to a minimum.
5. Add sodium hydrogen carbonate (4.3 g) to the flask. Not all of the solid will dissolve.
6. Slowly add the desired acid chloride with vigorous stirring. The mass of acid chloride required depends on the molecular weight of the phenolic resin monomer unit containing one hydroxy group and on the molecular weight of the acid chloride. For example, if the phenolic resin is LB 6564, (Mw=227, two hydroxy groups) and the acid chloride is p-toluenesulfonyl chloride (Mw=190.65) then 4.7 g of acid chloride is required to esterify one hydroxy group in 9.
7. Warm the reaction mixture for 6 hours at 40° C. with stirring.
8. After 6 hours, remove the flask from the water bath and allow to cool (about 30 mins).
9. Prepare a dilute solution by adding 8.6 g 1.18 s.g. hydrochloric acid to 354 g of distilled water.
10. Slowly precipitate the esterified resin drop-wise into the dilute acid with stirring.
11. Filter and wash the precipitate by re-slurrying in distilled water at least three times if possible until the pH of the filtrate reaches 6.0. In practice, it may only reach 5.5.
12. Dry the precipitate in a vacuum oven at 40° C. To make resins A to S below, having only functional groups Q, the acid chlorides were: p-toluenesulphonyl chloride, 2-naphthalenesulphonyl chloride, n-butanesulphonyl chloride, methanesulphonyl chloride, acetyl chloride, benzoyl chloride, dansyl (i.e. 5-dimethylaminonaphthalene-1-sulphonyl) chloride and 2-thiophenesulphonyl chloride.

Resins A to S and the preparative processes therefor, are summarised as follows:

| Modified Resin | Starting Resin | Mw of monomer | Acid Chloride | Mw of acid chloride | Mass of acid chloride (g) | Reaction Yield (%) |
|---|---|---|---|---|---|---|
| A | LB 6564 | 227 (2 × OH) | P-TOLUENESULPHONYL | 190.65 | 4.7 | 85 |
| B | LB 6564 | 227 (2 × OH) | P-TOLUENESULPHONYL | 190.65 | 2.35 | 70 |
| C | LB 6564 | 227 (2 × OH) | P-TOLUENESULPHONYL | 190.65 | 1.18 | 75 |
| D | LB 6564 | 227 (2 × OH) | P-TOLUENESULPHONYL | 190.65 | 9.4 | 75 |
| E | LB 6564 | 227 (2 × OH) | 2-NAPHTHALENESULPHONYL | 226.68 | 5.6 | 85 |
| F | LB 6564 | 227 (2 × OH) | N-BUTANESULPHONYL | 156.63 | 3.9 | 45 |
| G | LB 6564 | 227 (2 × OH) | METHANESULPHONYL | 114.55 | 2.8 | 25 |
| H | LB 6564 | 227 (2 × OH) | ACETYL | 78.5 | 1.94 | 90 |
| I | LB 6564 | 227 (2 × OH) | BENZOYL | 140.57 | 3.5 | 70 |
| J | LB 744 | 120 (1 × OH) | P-TOLUENESULPHONYL | 190.65 | 4.45 | 94 |
| K | LG 724 | 106 (1 × OH) | P-TOLUENESULPHONYL | 190.65 | 5.03 | 96 |
| L | PHS-4 | 120 (1 × OH) | P-TOLUENESULPHONYL | 190.65 | 4.45 | 90 |
| M | LB 6564 | 227 (2 × OH) | DANSYL | 269.75 | 6.65 | 92 |
| N | LB 6564 | 227 (2 × OH) | 2-THIOPHENESULPHONYL | 182.65 | 4.5 | 95 |
| O | PD-390A | 120 (1 × OH) | P-TOLUENESULPHONYL | 190.65 | 4.43 | 85 |
| P | SD-423A | 120 (1 × OH) | P-TOLUENESULPHONYL | 190.65 | 4.43 | 97 |
| Q | SD-443A | 120 (1 × OH) | P-TOLUENESULPHONYL | 190.65 | 4.43 | 85 |
| R | SD-444A | 120 (1 × OH) | P-TOLUENESULPHONYL | 190.65 | 4.43 | 94 |
| S | PD-494A | 120 (1 × OH) | P-TOLUENESULPHONYL | 190.65 | 4.43 | 85 |

The identity of the modified resins was confirmed by IR spectroscopy. Sample solutions (resin in 1-methoxypropan-2-ol) were coated down on a front surface mirror using a wire wound bar. The solution concentrations were selected to provide the specified dry film compositions with a coating weight of 2.0 $gm^{-2}$ after thorough drying at 100° C. in an oven for 3 minutes. The coated mirror was placed in a Perkin Elmer specular reflectance adaptor and IR transmission spectra measured in a Perkin FT-IR 2000 spectrometer. For, comparative purposes unmodified resins were also tested.

| Resin | O-II stretch cw$^{-1}$ | S=O stretch cw$^{-1}$ | SO$_2$ stretch cw$^{-1}$ | —SO$_2$—O— stretch cw$^{-1}$ | Saturated —CO—O— stretch cw$^{-1}$ |
|---|---|---|---|---|---|
| LB6564 | 3375 (Br) | — | — | — | — |
| A | 3492 (Br) | 1082 (s) | 1175 (s) | 1358 (s) | — |
| B | 3358 (Br) | 1082 (m) | 1175 (m) | 1357 (s) | — |
| C | 3345 (Br) | 1082 (w) | 1175 (w) | 1357 (m) | — |
| D | 3498 (Br) | 1083 (s) | 1177 (s) | 1362 (s) | — |
| E | 3496 (Br) | 1074 (s) | 1133 (m) | 1353 (s) | — |
| F | 3395 (Br) | 1068 (s) | 1140 (m) | 1344 (s) | — |
| G | 3375 (Br) | 1070 (w) | 1160 (m) | 1348 (s) | — |
| H | 3346 (Br) | — | — | — | 1700 (s) |
| I | 3386 (Br) | — | — | — | 1713 (s) |
| J | 3388 (Br) | 1085 (m) | 1178 (s) | 1358 (s) | — |
| K | 3388 (Br) | 1082 (s) | 1171 (s) | 1360 (s) | — |
| L | 3363 (Br) | 1092 (s) | 1151,1198 (s) | 1367 (m) | — |
| M | 3335 (Br) | 1096 (s) | 1148 (s) | 1359 (s) | — |
| N | 3384 (Br) | 1094 (s) | 1191 (s) | 1369 (s) | — |
| O | 3384 (Br) | 1093 (s) | 1192 (s) | 1361 (s) | — |
| P | 3510 (Br) | 1086 (s) | 1146 (m) | 1364 (s) | — |
| Q | 3279 (Br) | 1084 (s) | 1168 (s) | 1362 (s) | — |
| R | 3356 (Br) | 1083 (s) | 1179 (s) | 1361 (s) | — |
| S | 3384 (Br) | 1083 (s) | 1179 (s) | 1361 (s) | — |
| PHS-4 | 3354 (Br) | — | — | — | — |
| LG724 | 3336 (Br) | — | — | — | — |
| LB744 | 3335 (Br) | — | — | — | — |
| PD-390A | 3346 (Br) | — | — | — | — |
| SD-423A | 3427 )Br) | — | — | — | — |
| SD-443A | 3242 (Br) | — | — | — | — |
| SD-444A | 3300 (Br) | — | — | — | — |
| PD-494A | 3313 (Br) | — | — | — | — |
| NW 6564 | 3362 (Br) | 1099 (s) | 1154 (m) | 1361 (s) | — |

The process described above was used to prepare further resins having functional groups Q and additional functional groups.

Resin T was the resultant resin when HSL-l was reacted with 214-NQD chloride, (18 a) and m-chlorosulphonylbenzoic acid (6.6 g).

Resin U was the resultant resin when LB6564 (100 g) was reacted with 214-NQD chloride (18 g) and benzoyl chloride (2.8 g).

Resin V was the resultant resin when LB6564 (100 g) was reacted with 214-NQD chloride (18 g) and m-chlorosulphonylbenzoic acid (11 g).

Resin W was the resultant resin when Resin HSL-l was reacted with 214-NQD chloride (18 g) and m-chlorosulphonylcinnamic acid (7.5 g).

Resin X was the resultant resin when LB6564 (100 g) was reacted with 214-NQD chloride (18 g) and tosyl chloride (9.5 g).

Example numbers given below which are preceded with a C, for example C49, are examples not in accordance with the invention, present herein for comparison or reference purposes.

Dissolution Inhibition Tests

Coating formulations for examples 1–C58 below were prepared as solutions in 1-methoxypropan-2-ol. The substrate used was a 0.3 mm sheet of aluminium that had been electrograined and anodised and post-anodically treated with an aqueous solution of an inorganic phosphate. The coating solutions were coated onto the substrate by means of a wire wound bar. The solution concentrations was selected to provide the specified dry film compositions with a coating weight of 2.0 gm$^{-2}$ after thorough drying at 100° C. in an oven for 3 minutes.

| Resin | Example | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | 19 |
| | Parts by Weight | | | | | | | | | | | | | | | | | | |
| LB 6564 | | 50 | 75 | | 50 | 75 | | 50 | | | 50 | 75 | | 50 | 75 | | 50 | 75 | |
| Resin A | 100 | 50 | 25 | | | | | | | | | | | | | | | | |
| Resin B | | | | 100 | 50 | 25 | | | | | | | | | | | | | |
| Resin C | | | | | | | 100 | 50 | | | | | | | | | | | |
| Resin D | | | | | | | | | 100 | 50 | 25 | | | | | | | | |
| Resin E | | | | | | | | | | | | 100 | 50 | 25 | | | | | |
| Resin F | | | | | | | | | | | | | | | 100 | 50 | 25 | | |
| Resin G | | | | | | | | | | | | | | | | | | 100 | |
| Resin H | | | | | | | | | | | | | | | | | | | 100 |

-continued

| Resin | Example | | | | | | | | | | | | | | | | | | | |
|---|---|---|---|---|---|---|---|---|---|---|---|---|---|---|---|---|---|---|---|---|
| | 20 | 21 | 22 | 23 | 24 | 25 | 26 | 27 | 28 | 29 | 30 | 31 | 32 | 33 | 34 | 35 | 36 | 37 | 38 | 39 |
| | | | | | | | | | Parts by Weight | | | | | | | | | | | |
| LB 6564 | | | 50 | 75 | | 50 | 75 | | | 50 | 75 | | 50 | 75 | | 50 | 75 | | 50 | 75 |
| Resin I | 100 | 50 | 25 | | | | | | | | | | | | | | | | | |
| Resin J | | | | 100 | 50 | 25 | | | | | | | | | | | | | | |
| Resin K | | | | | | | 100 | | | | | | | | | | | | | |
| Resin L | | | | | | | | 100 | | | | | | | | | | | | |
| Resin M | | | | | | | | | 100 | 50 | 25 | | | | | | | | | |
| Resin N | | | | | | | | | | | | 100 | 50 | 25 | | | | | | |
| Resin O | | | | | | | | | | | | | | | 100 | 50 | 25 | | | |
| Resin P | | | | | | | | | | | | | | | | | | 100 | 50 | 25 |

| Resin | Example | | | | | | | | | | | | | | | | | | | |
|---|---|---|---|---|---|---|---|---|---|---|---|---|---|---|---|---|---|---|---|---|
| | 40 | 41 | 42 | 43 | 44 | 45 | 46 | 47 | 48 | C49 | C50 | C51 | C52 | C53 | C54 | C55 | C56 | C57 | C58 | |
| | | | | | | | | | Parts by Weight | | | | | | | | | | | |
| LB 6564 | | 50 | 75 | | 50 | 75 | | 50 | 75 | 100 | | | | | | | | | | |
| Resin Q | 100 | 50 | 25 | | | | | | | | | | | | | | | | | |
| Resin R | | | | 100 | 50 | 25 | | | | | | | | | | | | | | |
| Resin S | | | | | | | 100 | 50 | 25 | | | | | | | | | | | |
| PD-390A | | | | | | | | | | | 100 | | | | | | | | | |
| SD-423A | | | | | | | | | | | | 100 | | | | | | | | |
| SD-443A | | | | | | | | | | | | | 100 | | | | | | | |
| SD-444A | | | | | | | | | | | | | | 100 | | | | | | |
| PD-494A | | | | | | | | | | | | | | | 100 | | | | | |
| PHS-4 | | | | | | | | | | | | | | | | 100 | | | | |
| LB744 | | | | | | | | | | | | | | | | | 100 | | | |
| LG724 | | | | | | | | | | | | | | | | | | 100 | | |
| NW6564 | | | | | | | | | | | | | | | | | | | 100 | |

The substrates of examples 1 to C58 above were tested for developability by immersing in an aqueous solution at 20° C. for an appropriate time using an appropriate aqueous developer solution as described below.

The following table lists results of the simple developability tests for the compositions:

| | Developer | Time to fully remove coating/ seconds | Remarks |
|---|---|---|---|
| 1 | D1 | >600 | No significant coating removal at 600 seconds |
| 2 | D1 | 540 | |
| 3 | D1 | 60 | |
| 4 | D1 | 180 | |
| 5 | D1 | 60 | |
| 6 | D1 | 15 | |
| 7 | D1 | 120 | |
| 8 | D1 | 15 | |
| 9 | D1 | >600 | No significant coating removal at 600 seconds |
| 10 | D1 | >600 | Partial coating removal at 600 seconds |
| 11 | D1 | 300 | |
| 12 | D1 | >600 | Partial coating removal at 600 seconds |
| 13 | D1 | 300 | |
| 14 | D1 | 60 | |
| 15 | D1 | >600 | No significant coating removal at 600 seconds |
| 16 | D1 | 600 | |
| 17 | D1 | 300 | |
| 18 | D1 | 30 | |
| 19 | D3 | 30 | |
| 20 | D1 | 300 | |
| 21 | D1 | 240 | |
| 22 | D1 | 45 | |
| 23 | D1 | >600 | No significant coating removal at 600 seconds |
| 24 | D1 | 420 | |
| 25 | D1 | 160 | |
| 26 | D2 | 10 | |
| 27 | D3 | 45 | |
| 28 | D1 | 600 | |
| 29 | D1 | 180 | |
| 30 | D1 | 30 | |
| 31 | D1 | >300 | No significant coating removal at 600 seconds |
| 32 | D1 | 60 | |
| 33 | D1 | 15 | |
| 34 | D1 | >300 | No significant coating removal at 600 seconds |
| 35 | D1 | 240 | |
| 36 | D1 | 15 | |
| 37 | D1 | 240 | |
| 38 | D1 | 30 | |
| 39 | D1 | 15 | |
| 40 | D1 | 10 | |
| 41 | D2 | 20 | |
| 41 | D2 | 10 | |
| 43 | D1 | >300 | No significant coating removal at 600 seconds |
| 44 | D1 | 300 | |
| 45 | D1 | 15 | |
| 46 | D1 | >300 | No significant coating removal at 600 seconds |
| 47 | D1 | 240 | |
| 48 | D1 | 15 | |
| C49 | D1 | 6 | |
| C49 | D2 | 6 | |
| C49 | D3 | 10 | |
| C50 | D1 | 10 | |

| Developer | Time to fully remove coating/ seconds | Remarks |
|---|---|---|
| C51 | D1 | 5 | |
| C52 | D1 | 5 | |
| C53 | D1 | 140 | |
| C54 | D1 | 140 | |
| C55 | D3 | 10 | |
| C56 | D3 | 30 | |
| C57 | D3 | 10 | |
| C58 | D1 | >600 | No significant coating removal at 600 seconds |

Direct Heat Imaging

Coated plates were made as described above in the section on dissolution inhibition tests, also using the formulations identified as examples 1 to C58 above.

Samples of the plate were subjected to heat delivered from a Weller soldering iron EC 2100 M heated to 311° C. The speed of movement of the soldering iron over the plate surface was 1 cms$^{-1}$ in every case. The soldering face was applied to the coated face of each sample in every case. The treated plate samples were then processed by immersion in an appropriate developer at 20° C. for 30 seconds. The results are listed in the table below.

| Example | Developer | Developability Test Results |
|---|---|---|
| 1 | D2 | All coating removed |
| 1 | D1 | No coating removed |
| 2 | D1 | No coating removed |
| 3 | D1 | Coating totally removed only in area subjected to heat |
| 4 | D1 | No coating removed |
| 5 | D1 | Coating totally removed only in area subjected to heat |
| 6 | D1 | All coating removed |
| 7 | D1 | Coating totally removed only in area subjected to heat |
| 8 | D1 | Coating totally removed only in area subjected to heat, partial coating removed in unheated areas |
| 9 | D1 | No coating removed |
| 10 | D1 | No coating removed |
| 11 | D1 | No coating removed |
| 12 | D1 | No coating removed |
| 13 | D1 | No coating removed |
| 14 | D1 | Coating totally removed only in area subjected to heat |
| 15 | D1 | No coating removed |
| 16 | D1 | No coating removed |
| 17 | D1 | Coating totally removed only in area subjected to heat |
| 18 | D1 | Coating totally removed only in area subjected to heat |
| 19 | D3 | Coating totally removed only in area subjected to heat |
| 20 | D1 | No coating removed |
| 21 | D1 | Coating totally removed only in area subjected to heat |
| 22 | D1 | Coating totally removed only in area subjected to heat |
| 23 | D1 | No coating removed |
| 24 | D1 | No coating removed |
| 25 | D1 | Coating totally removed only in area subjected to heat |
| 26 | D3 | Coating totally removed only in area subjected to heat |
| 27 | D3 | Coating totally removed only in area subjected to heat |
| 28 | D1 | No coating removed |
| 29 | D1 | Coating totally removed only in area subjected to heat |
| 30 | D1 | All coating removed |
| 31 | D1 | No coating removed |
| 32 | D1 | Coating totally removed only in area subjected to heat |
| 33 | D1 | All coating removed |
| 34 | D1 | No coating removed |
| 35 | D1 | No coating removed |
| 36 | D1 | Coating totally removed only in area subjected to heat |
| 37 | D1 | No coating removed |
| 38 | D1 | No coating removed |
| 39 | D1 | Coating totally removed only in area subjected to heat |
| 40 | D3 | Coating totally removed only in area subjected to heat |
| 41 | D3 | Coating totally removed only in area subjected to heat |
| 42 | D3 | Coating totally removed only in area subjected to heat |
| 43 | D1 | No coating removed |
| 44 | D1 | Coating totally removed only in area subjected to heat |
| 45 | D1 | Coating totally removed only in area subjected to heat |
| 46 | D1 | No coating removed |
| 47 | D1 | Coating totally removed only in area subjected to heat |
| 48 | D1 | Coating totally removed only in area subjected to heat |
| C49 | D1 | All coating removed |
| C50 | D1 | All coating removed |
| C51 | D1 | All coating removed |
| C52 | D3 | All coating removed |
| C53 | D1 | All coating removed |
| C54 | D1 | All coating removed |
| C55 | D3 | All coating removed |
| C56 | D3 | Coating totally removed only in area subjected to heat |
| C57 | D3 | All coating removed |
| C58 | D1 | Coating totally removed only in area subjected to heat |

Laser Thermal Imaging

Coating formulations for examples 59 to 72 below were prepared as solutions in 1-methoxypropan-2-ol. The substrate used was a 0.3 mm sheet of aluminium that had been electrograined and anodised and post-anodically treated with an aqueous solution of an inorganic phosphate. The coating solutions were coated onto the substrate by means of a wire wound bar. For examples 59 to 61, the solution concentrations were selected to provide the specified-dry film compositions with a coating weight of 1.5 gm$^{-2}$ after thorough drying at 100° C. in an oven for 3 minutes. For examples 62 to 72, the solution concentrations were selected to provide the specified dry film compositions with a coating weight of 2.0 gm$^{-2}$ after thorough drying at 130° C. in an oven for 80 seconds.

| Component | Examples | | | | | | | | | | | | | |
|---|---|---|---|---|---|---|---|---|---|---|---|---|---|---|
| | 59 | 60 | 61 | 62 | 63 | 64 | 65 | 66 | 67 | 68 | 69 | 70 | 71 | 72 |
| | Parts by Weight | | | | | | | | | | | | | |
| Resin A | 24.5 | 36.75 | 49 | | | | | | | | | | | |
| Resin B | | | | 98 | | | | | | | | | | |
| Resin C | | | | | 98 | | | | | | | | | |
| Resin D | | | | | | 11.75 | | | | | | | | |
| Resin E | | | | | | | | | 24 | | | | | |
| Resin J | | | | | | | 39.2 | 19.6 | | | | | | |

-continued

| Component | | | | | | | | | | | | | | |
|---|---|---|---|---|---|---|---|---|---|---|---|---|---|---|
| Resin L | | | | | | | | | 96 | 96 | | | | |
| Resin V | | | | | | | | | | | 96 | | | |
| Resin W | | | | | | | | | | | | 96 | | |
| Resin X | | | | | | | | | | | | | 96 | |
| LB6564 | 73.5 | 61.25 | 49 | | | 86.25 | 58.8 | 78.4 | 72 | | | | | |
| Dye A | 2 | 2 | 2 | 2 | 2 | 2 | 2 | 2 | 2 | 2 | 2 | 2 | 2 | 2 |
| Dye B | | | | | | | | | 2 | 2 | 2 | 2 | 2 | 2 |

Samples of the plates were then imaged. The coated substrate to be imaged was cut into a circle of 105 mm diameter and placed on a disc that could be rotated at a constant speed between 100 and 2500 revolutions per minute. Adjacent to the spinning disc a translating table held the source of the laser beam so that the laser beam impinged perpendicular to the coated substrate, while the translating table moved the laser beam radially in a linear fashion with respect to the spinning disc.

The laser used was a single mode 830 nm wavelength 200 mW laser diode which was focused to a 10 micron resolution. The laser supply was a stabilised constant current source.

The exposed image was in the form of a spiral whereby the image in the centre of the spiral represented slow laser scanning speed and long exposure time and the outer edge of the spiral represented fast scanning speed and short exposure time. Imaging energies were derived from the measurement of the diameter at which an image was formed.

The minimum energy that can be delivered by this exposure system is 120 mJcm$^{-2}$ at an rpm of 2500.

The exposed discs were then processed by immersing in the specified developer for an appropriate time. Plate sensitivities were then determined. The results are listed in the following table.

| Example | Developer | Time/seconds | Sensitivity (mJcm$^{-4}$) |
|---|---|---|---|
| 59 | D1 | 60 | <120 |
| 60 | D1 | 60 | <120 |
| 61 | D1 | 60 | 120 |
| 62 | D1 | 90 | 220 |
| 63 | D1 | 30 | 150 |
| 64 | D1 | 30 | 135 |
| 65 | D1 | 180 | 340 |
| 66 | D1 | 45 | 135 |
| 67 | D1 | 60 | 135 |
| 68 | D6 | 240 | 130 |
| 69 | D5 | 60 | 250 |
| 70 | D1 | 60 | <150 |
| 71 | D1 | 60 | 220 |
| 72 | D1 | 240 | 420 |

For reference purposes one base resin, example C73, and two NQD resin esters, examples C74 and C75, these reference examples C73, C74 and C75 not being in accordance with the invention, were tested. The coating formulations for examples C73–C75 were prepared as solutions in 1-methoxypropan-2-ol. The coating solutions were coated as described with reference to examples 59–72. The solution concentrations were selected to provide the specified dry film compositions with a coating weight of 2.0 gm$^{-2}$ after thorough drying at 130° C. in an oven for 80 seconds.

| | Reference Examples | | |
|---|---|---|---|
| | C73 | C74 | C75 |
| Component | Parts by weight | | |
| NW6564 | | 48 | 24 |
| LB6564 | 96 | 48 | 72 |
| Dye A | 2 | 2 | 2 |
| Dye B | 2 | 2 | 2 |

Comparative examples C73, C74, and C75 were then imaged using the 830 nm laser imaging device described. Exposed samples were processed by immersing in developer D1 for 60 seconds. Plate sensitivities were then determined. The results are listed in the following table.

| Comparative example | Sensitivity (mJcm$^{-2}$) | Comments |
|---|---|---|
| C73 | 60 | All coating is removed |
| C74 | 300 | |
| C75 | 130 | |

Experiments were carried out using alternative substrates. Thus, further examples 76 to 79 were prepared as solutions in 1-methoxypropan-2-ol. The coating solutions were coated onto an appropriate support by means of a wire wound bar. For these examples, the solution concentrations were selected to provide the specified dry film compositions with a coating weight of 2.0 gm$^{-2}$ after thorough drying at 130° C. in an oven for 80 seconds

| Component | Examples 76–79 Parts by weight |
|---|---|
| Resin C | 96 |
| Dye A | 2 |
| Dye B | 2 |

For example 76 the support was aluminium (0.3 mm gauge), degreased with NaOH (2.5M, 20° C.), rinsed with developer D2 (1 minute, 20° C.).

For example 77 the support used was copper sheet, degreased with acetone (20° C.), rinsed with HNO$_3$ (1.1M, 20° C., 10 seconds).

For example 78 the support used was aluminised paper number 1 as supplied by Samuel Grant Ltd., Leeds, UK.

For example 79 the support used was aluminised paper number 4 as supplied by Samuel Grant Ltd.

Examples 76 to 79 were imaged using the 830 nm laser imaging device described. Exposed samples were processed by immersing in a suitable aqueous developer solution for an appropriate time. Plate sensitivities were then determined. The results are listed in the following table.

| Example | Developer | Time/seconds | Sensitivity (mJcm$^{-2}$) |
|---|---|---|---|
| 76 | D1 | 30 | 150 |
| 77 | D1 | 30 | <150 |
| 78 | D1 | 15 | 150 |
| 79 | D1 | 120 | 300 |

UV Imaging

Coating formulations for examples 80 to C101 below were prepared as previously described as solutions in 1-methoxypropan-2-ol. The formulations were coated as described with reference to examples 59 to 72 above. For examples 80, 81, 82, 89 and 90, the solution concentrations were selected to provide the specified dry film compositions with a coating weight of 1.5 gm$^{-2}$ after thorough drying at 100° C. in an oven for 3 minutes. For examples 83 to 88 and 94 to C101, the solution concentrations were selected to provide the specified dry film compositions with a coating weight of 2.0 gm$^{-2}$ after thorough drying at 130° C. in an oven for 80 seconds.

For examples 91 to 93, the solution concentrations were selected to provide the specified dry film compositions with a coating weight of 1.5 gm$^{-2}$ after thorough drying at 130° C. in an oven for 80 seconds.

| Example | UV Lightframe Exposure Units | Developer | Time/seconds | Sensitivity |
|---|---|---|---|---|
| 80 | 142 | D1 | 60 | Clear 10 |
| 81 | 142 | D1 | 60 | Clear 7 |
| 82 | 142 | D1 | 60 | Clear 7 |
| 83 | 80 | D1 | 60 | Clear 4 |
| 84 | 80 | D1 | 180 | Trace 3 |
| 85 | 80 | D1 | 90 | Trace 4 |
| 86 | 80 | D1 | 90 | Trace 3 |
| 87 | 80 | D1 | 60 | Clear 4 |
| 88 | 80 | D1 | 60 | Trace 5 |
| 89 | 55 | D1 | 60 | Clear 3 |
| 89 | 55 | D2 | 60 | Clear 2 |
| 89 | 55 | D4 | 60 | Clear 3 |
| 90 | 112 | D1 | 120 | Clear 5 |
| 91 | 112 | D1 | 300 | Trace 2 |
| 92 | 112 | D1 | 60 | Clear 2 |
| 93 | 112 | D1 | 300 | Trace 2 |
| 94 | 80 | D2 | 60 | Trace 7 |
| 95 | 80 | D2 | 30 | Trace 8 |
| 96 | 80 | D5 | 60 | Trace 3 |
| 97 | 80 | D6 | 60 | Clear 5 |
| 98 | 80 | D1 | 60 | Clear 5 |
| 99 | 80 | D1 | 60 | Clear 5 |
| C100 | 80 | D1 | 60 | Clear 9 |
| C100 | 142 | D1 | 60 | Trace 13 |
| C101 | 80 | D1 | 60 | All coating is removed |

Experiments were carried out using alternative substrates. Thus, examples 102–105 were prepared as solutions in 1-methoxypropan-2-ol. The coating solutions were coated onto an appropriate support by means of a wire wound bar. For these examples, the solution concentrations were selected to provide the specified dry film compositions with a coating weight of 2.0 gm$^{-2}$ after thorough drying at 130° C. in an oven for 80 seconds.

| Component | 80 | 81 | 82 | 83 | 84 | 85 | 86 | 87 | 88 | 89 | 90 | 91 | 92 | 93 | 94 | 95 | 96 | 97 | 98 | 99 | C100 | C101 |
|---|---|---|---|---|---|---|---|---|---|---|---|---|---|---|---|---|---|---|---|---|---|---|
| | | | | | | | | | | | | Parts by Weight | | | | | | | | | | |
| Resin A | 20 | 30 | 40 | | | | | | | 39 | 45 | | | | | | | | | | | |
| Resin F | | | | 40 | | | | | | | | | | | | | 40 | | | | | |
| Resin I | | | | | 80 | 40 | | | | | | 45 | | | | | | | | | | |
| Resin J | | | | | | | 48 | 32 | 16 | | | | 18 | 36 | | | | | | | | |
| Resin K | | | | | | | | | | | | | | | 80 | | | | | | | |
| Resin L | | | | | | | | | | | | | | | | 80 | | 80 | | | | |
| Resin T | | | | | | | | | | | | | | | | | | | 100 | | | |
| Resin U | | | | | | | | | | | | | | | | | | | | 100 | | |
| LB6564 | 60 | 50 | 40 | 40 | | 40 | 32 | 48 | 64 | 39 | 45 | 45 | 72 | 54 | | 40 | | | | | 80 | 90 |
| PC-A | 20 | 20 | 20 | 20 | 20 | 20 | 20 | 20 | 20 | 20 | | | | | 20 | 20 | 20 | | | | 20 | |
| Dye B | | | | | | | | | | 1 | | | | | | | | | | | | |
| AG-A | | | | | | | | | | 1 | | | | | | | | | | | | |
| PC-B | | | | | | | | | | | 10 | 10 | 10 | 10 | | | | | | | | 10 |

Samples of the plates were then imaged using a Montakop UV lightframe using a TH 3020 diazo bulb supplied by Siegfried Theimer GmbH, of Germany. This emits UV radiation predominantly distributed in the wavelength band 400–440 nm. The number of exposure units was as described in the table herein and a 20:20 vacuum with a mask (a Stouffer 21 step sensitivity guide) and then processed by immersing in a suitable aqueous developer solution for an appropriate time. Plate sensitivities were then determined. The results are listed in the following table.

| Component | Examples 102–105 Parts by weight |
|---|---|
| LB 6564 | 48 |
| Resin J | 32 |
| PC-A | 20 |

For example 102 the support used was aluminium with a hydrophilic coating comprising a silicate composition containing also titania and alumina.

For example 103 the support used was non-grained, anodised only aluminium.

For example 104 the support used was aluminised polyethylene as supplied by HiFi Industrial Film Ltd., Stevenage, UK.

For example 165 the support used was Planfoil polyester montage foil (0.18 mm thickness) as supplied by Kodak Polychrome Graphics/Horsell, Leeds, UK.

Examples 102 to 105 were then imaged using the Montakop UV lightframe as described herein. Exposed samples were processed by immersing in a suitable aqueous developer solution for an appropriate time. Plate sensitivities were then determined. The results are listed in the following table.

| Example | UV lightframe exposure/units | Developer | Time/seconds | Sensitivity |
|---|---|---|---|---|
| 102 | 80 | D1 | 60 | Clear 6 |
| 103 | 50 | D1 | 60 | Clear 7 |
| 104 | 50 | D1 | 60 | Trace 4 |
| 105 | 50 | D1 | 60 | Trace 3 |

Experiments were carried out using resins of the invention in admixture with larger amounts of ordinary NQD resin esters, for plate performance enhancement. In these experiments a wide range of developers was trialled.

Coating formulations for examples 106 to C112 were prepared as solutions in 1-methoxypropan-2-ol. The coating solutions were coated as described in examples 59–72. The solution concentrations were selected to provide the specified dry film compositions with a coating weight of 2.0 gm$^{-2}$ after thorough drying at 130° C. for 80 seconds.

| Component | Examples | | | | | | |
|---|---|---|---|---|---|---|---|
|  | 106 | 107 | 108 | 109 | 110 | 111 | C112 |
|  | Parts by Weight | | | | | | |
| Resin HSL-2 | 93.1 | 83.3 | 73.5 | 93.1 | 83.3 | 73.5 | 98 |
| Resin E | 4.9 | 14.7 | 24.5 |  |  |  |  |
| Resin X |  |  |  | 4.9 | 14.7 | 24.5 |  |
| AG-A | 1 | 1 | 1 | 1 | 1 | 1 | 1 |
| Dye B | 1 | 1 | 1 | 1 | 1 | 1 | 1 |

Examples 106 to C112 were then imaged using the Montakop UV lightframe (80 units exposure time) as described herein. Exposed samples were processed by immersing in a suitable aqueous developer solution for 60 seconds. Plate sensitivities were then determined. The results are listed in the following table.

| Example | Developer | Sensitivity |
|---|---|---|
| 106 | D1 | Clear 3 |
| 106 | D4 | Trace 7 |
| 106 | D7 | Trace 9 |
| 106 | D8 | Trace 9 |
| 106 | D9 | Clear 7 |
| 107 | D1 | Trace 4 |
| 107 | D4 | Trace 7 |
| 107 | D7 | Trace 10 |
| 107 | D8 | Clear 9 |
| 107 | D9 | Clear 7 |
| 108 | D1 | Clear 3 |
| 108 | D4 | Trace 6 |
| 108 | D7 | Trace 9 |
| 108 | D8 | Clear 8 |
| 108 | D9 | Trace 6 |
| 109 | D1 | Clear 3 |
| 109 | D4 | Clear 6 |
| 109 | D7 | Clear 8 |
| 109 | D8 | Trace 7 |
| 109 | D9 | Clear 6 |
| 110 | D1 | Trace 4 |
| 110 | D4 | Trace 7 |
| 110 | D7 | Clear 10 |
| 110 | D8 | Trace 9 |
| 110 | D9 | Trace 7 |
| 111 | D1 | Clear 3 |
| 111 | D4 | Trace 7 |
| 111 | D7 | Trace 10 |
| 111 | D8 | Clear 7 |
| 111 | D9 | Clear 6 |
| C112 | D1 | Clear 3 |
| C112 | D4 | Trace 6 |
| C112 | D7 | Clear 8 |
| C112 | D8 | Trace 8 |
| C112 | D9 | Trace 6 |

Electron Imaging

Coating formulations for examples 113 to C116 below were prepared in 1-methoxypropan-2-ol. The coating solutions were coated as described in examples 59 to 72 above. The solution concentrations were selected to provide the specified dry film compositions with a coating weight of 2.0 gm$^{-2}$ after thorough drying at 130° C. in an oven for 80 seconds.

| Component | Examples | | | |
|---|---|---|---|---|
|  | 113 | 114 | 115 | C116 |
|  | Parts by weight | | | |
| LB 6564 | 48 |  | 50 | 84 |
| PC-A | 20 |  |  |  |
| Resin J | 32 |  |  |  |
| Resin B |  | 98 |  |  |
| Dye A |  | 2 |  |  |
| Resin A |  |  | 50 |  |
| FW2 |  |  |  | 12 |
| Mon-C |  |  |  | 4 |

The samples to be imaged were cut into squares 2.0 cm×2.0 cm, glued to aluminium mounting stubs and imaged using an electron beam from a Hitachi S4100 scanning electron microscope. The conditions were as follows:

25 kV accelerating voltage 5 kV extraction voltage

20 μA emission current aperture number 2 condenser lens 3 working distance 13 mm

The exposed samples were then processed by immersing in developer D1 for an appropriate time. Plate sensitivities were then determined. The results are listed in the following table.

| Example | Time/ seconds | Developability Test Result |
|---------|---------------|----------------------------|
| 113 | 60 | Coating only removed in area subjected to electrons |
| 114 | 90 | Coating only removed in area subjected to electrons |
| 115 | 60 | Coating only removed in area subjected to electrons |
| C113 | 180 | Coating only removed in area subjected to electrons |

Use of Pigments

The stated pigment and LB6564 resin (at a ratio of 1:4 wt % (w:w)) were ball milled together for four days such that the dispersed mill-base had a solids content of 30% in 1-methoxypropan-2-ol and a particle size of <10 microns as determined by grind gauge. The mill-base was then mixed together with a solution of the modified resin A (in 1-methoxypropan-2-ol) and, in the case of example 117, an additional solution of LB6564 (1-methoxypropan-2-ol). Consequently, the coating formulations for examples 117 and 118 were prepared entirely as solutions in 1-methoxypropan-2-ol. The substrate used was a 0.3 mm sheet of aluminium that had been electrograined and anodised and post-anodically treated with an aqueous solution of an inorganic phosphate. The coating solutions were coated onto the substrate by means of a wire wound bar. The solution concentrations were selected to provide the specified dry film compositions with a coating weight of 2.2 gm$^{-2}$ after thorough drying at 100° C. in an oven for 3 minutes.

| | Examples | |
|---|---|---|
| | 117 | 118 |
| Component | Parts by weight | |
| LB6564 | 45 | 40 |
| Resin A | 50 | 50 |
| Carbon Black | 5 | |
| Prussian Blue | | 10 |

The plates were then given a stabilizing heat treatment in an oven at 55° C. for five hours.

The heat treated plates were then imaged on the Creo Trendsetter at 8 watts with a 50% screen image at imaging energy densities of 160, 180, 200, 220, 240 and 260 mJcm$^{-2}$. The exposed plates were then developed using a Horsell Mercury Mark V plate processor containing Developer D1 at 22° C. the processing speed was set at 750 mm min$^{-1}$. Finally images produced were evaluated visually and were measured using a Tobias plate check densitometer as supplied by Tobias Associates Inc. of Ivyland, Pa., USA.

| | Imaging energy density required for 50% dot/mJcm$^{-2}$ |
|---|---|
| Example 117 | 190 |
| Example 118 | 220 |

Evaluation of Inherent Suitability of Resins

The inherent suitability or otherwise of resins was evaluated by Tests 1 to 5 in accordance with the above description.

Resins tested: LB 6564, modified Resins A, E, G and I.

Test 1: LB6564 resin was dissolved in 1-methoxypropan-2-ol, dried at 130° C. for 80 seconds Film weight=2.0 gm$^{-2}$.

The composition was ink accepting when laid down as a coating.

Test passed.

Test 2: The coating of Test 1 was processed in developers, as follows:

Developer D1, 20° C., 30 seconds

Developer D2, 20° C., 30 seconds

No ink surfaces were obtained.

Tests passed.

Test 3: The modified resins were dissolved in 1-methoxypropan-2-ol, dried at 130° C. for 80 seconds Film weight=2.0 gm$^{-2}$.

The compositions were ink accepting when laid down as coatings.

Tests passed.

Test 4: The coatings of Test 3 were processed in developers, as follows:

Resins A,E,I: developer D1, 20° C., 60 seconds, Ink surfaces were obtained.

Resin G: developer D2, 20° C., 60 seconds.

Ink surfaces were obtained.

Tests passed.

Test 5: The plates were heated with a Weller soldering iron EC 2100 M heated to 150° C., then processed in a developer.

Resin A: Composition temperature reached 150° C. after 5 seconds, then held at 150° C. for 15 seconds.

Developer D1, 20° C., 60 seconds.

Resin E: Composition temperature reached 150° C. after 5 seconds, then held at 150° C. for 15 seconds.

Developer D1, 20° C., 60 seconds.

Resin G: Composition temperature reached 150° C. after 5 seconds, then held at 150° C. for 15 seconds.

Developer D1, 20° C., 60 seconds.

Resin I: Composition temperature reached 150° C. after 5 seconds, then held at 150° C. for 15 seconds.

Developer D1, 20° C., 60 seconds.

Plate temperatures were measured by thermocouple.

No ink surfaces were obtained.

Tests passed.

In the specification we refer in various places to UV, infra-red and visible radiation. A person skilled in the art will be aware of the typical wavelength ranges of these radiations. However, for the avoidance of any doubt, UV radiation typically has a wavelength range not exceeding about 450 nm. Visible radiation has a wavelength range of about 400 to 700 nm. Infra-red radiation typically has a wavelength range in excess of 600 nm, the boundaries between UV and visible radiation, and between infrared and visible radiation, not being sharp ones.

We make no claim herein to any method referred to in EP 410606, either in relation to the invention thereof or in the description therein of prior art. In particular, we make no claim herein to the use of a polymeric substance functionalised by o-nitrocarbinol compounds, (except as a possible additional substituent or component, of a composition in accordance with, the present invention).

We are aware of JP 207013/96, JP 302722/96, Jp 9264/97 and EP 823327A. In certain countries yet to be determined parts of the disclosure thereof or of equivalents thereto may be regarded as having an earlier priority date than the priority date of parts of the present application and, in that event only, and only in respect of such countries, we will make no claim to any such disclosure which is of earlier priority date.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group, and either: (1) the functional groups Q are selected from groups which comprise amino, monoalkylamino, dialkylamino, amido, monoalkylamido, dialkylamido, chloro, fluoro, carbonyl, sulphinyl or sulphonyl moieties, or (2) the functionalised polymeric substance is defined by the formula R—(Q)$_n$, wherein R represents the polymer chain of the polymeric substance and (Q)$_n$ represents functional groups bonded thereto, wherein Q represents a group of formula —T—Z, wherein T represents a group of formula —O—X(Z)—O— wherein X represents a linking moiety and Z is a moiety which optionally hydrogen bonds to the polymer chain R of the same molecule or an adjacent molecule or molecules.

2. A method as claimed in claim 1, wherein Z represents an optionally substituted alkyl, alkenyl, alkynyl, cycloalkyl, aryl, heteroaryl, heterocyclic, aralkyl or heteroaralkyl group.

3. A method as claimed in claim 2, wherein Z represents an optionally substituted aryl group, an optionally substituted heteroaryl group or an optionally substituted alkyl group.

4. A method as claimed in claim 1, wherein said functionalised polymeric substance is obtained by functionalization with said groups Q of a corresponding unfunctionalised polymeric substance to make the functionalised polymeric substance, wherein said unfunctionalised polymeric substance comprises hydroxy or thiol groups.

5. A method as claimed in claim 4, wherein the ratio of functional groups Q in the functionalised polymeric substance to hydroxy or thiol groups in the corresponding unfunctionalised polymeric substance is in the range 1:100 to 1:2.

6. A method as claimed in claim 5, wherein the said ratio is in the range 1:50 to 1:3.

7. A method as claimed in claim 6, wherein the said ratio is in the range 1:20 to 1:6.

8. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group, and either: (1) the functional groups Q are selected from groups which comprise amino, monoalkylamino, dialkylamino, amido, monoalkylamido, dialkylamido, chloro, fluoro, carbonyl, sulphinyl or sulphonyl moieties, or (2) the fuctionalised polymeric substance is selected from the group consisting of a phenolic resin and a polymer or copolymer of hydroxystyrene.

9. A method as claimed in claim 1, wherein the composition optionally contains an additional polymeric substance, the weight ratio of the functionalised polymeric substance to the additional polymeric substance being in the range 100:0 to 10:90.

10. A method as claimed in claim 9, wherein the said ratio is in the range 100:0 to 20:80.

11. A method as claimed in claim 9, wherein said additional polymeric substance is inherently developer soluble, when tested in the absence of the functionalised polymeric substance.

12. A method as claimed in claim 1, wherein said infrared radiation is converted to heat by the coating on the substrate, wherein the coating comprises said composition.

13. A method as claimed in claim 12, wherein the said composition itself absorbs said radiation and converts said radiation to heat.

14. A method as claimed in claim 12, wherein said composition comprises a radiation absorbing compound which absorbs said radiation and converts it to heat.

15. A method as claimed in claim 12, wherein said coating comprises an additional layer disposed beneath the said composition, wherein the additional layer comprises a radiation absorbing compound which absorbs said electromagnetic radiation and converts it to heat.

16. A method as claimed in claim 1, comprising the direct delivery of heat imagewise from a heated body, to the precursor.

17. A method as claimed in claim 1, wherein the developer is an aqueous alkaline solution.

18. A positive working precursor for use in a method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

19. A positive working precursor as claimed in claim 18, wherein the precursor is a lithographic printing form precursor, and the said composition is ink-accepting and is coated on a support having a surface which is not ink-accepting.

20. A positive working precursor as claimed in claim 18, wherein the precursor is for an electronic part or a mask.

21. A method of producing a precursor as claimed in claim 18, comprising applying the said coating to the said substrate.

22. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

23. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q are not chemically decomposed on exposure to said infrared radiation and the functional groups Q are selected from groups which comprise amino, monoalkylamino, dialkylamino, amido, monoalkylamido, dialkylamido, chloro, fluoro, carbonyl, sulphinyl or sulphonyl moieties.

24. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q are not additionally primarily responsible for the absorption of said infrared radiation and the functional groups Q are selected from groups which comprise amino, monoalkylamino, dialkylamino, amido, monoalkylamido, dialkylamido, chloro, fluoro, carbonyl, sulphinyl or sulphonyl moieties.

25. A method for producing a predetermined resist pattern on a substrate, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein there is hydrogen bonding between said functional groups Q and other groups of the same molecule or other molecules of the polymeric substance, and the functional groups Q are selected from groups which comprise amino, monoalkylamino, dialkylamino, amido, monoalkylamido, dialkylamido, chloro, fluoro, carbonyl, sulphinyl or sulphonyl moieties.

26. An imaged article produced by application of a method for producing a predetermined resist pattern on a substrate to a positive working precursor, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

27. A printing form produced by application of a method for producing a predetermined resist pattern on a substrate to a lithographic printing form precursor, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

28. An electronic part or a mask produced by application of a method for producing a predetermined resist pattern on a substrate to a positive working precursor, the method comprising: the patternwise application of infrared radiation to a precursor which comprises the substrate, having a coating thereon, the coating comprising a positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

29. A positive working composition for use in a method for producing a predetermined resist pattern on a substrate, the method comprising: the patternwise application of infrared radiation to a precursor which comprises the substrate, having a coating thereon, the coating comprising the positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

30. A functionalised polymeric substance, for use in a positive working composition for use in a method for producing a predetermined resist pattern on a substrate, the method comprising: the patternwise application of inferred radiation to a precursor which comprises the substrate, having a coating thereon, the coating comprising the positive working composition; and the development of the pattern using a developer; wherein said composition comprises a polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functional groups Q are selected from groups which comprise amino, monoalkylamino, dialkylamino, amido, monoalkylamido, dialkylamido, chloro, fluoro, carbonyl, sulphinyl or sulphonyl moieties.

31. A functionalised polymeric substance carrying a plurality of functional groups Q, wherein Q represents either (a) a group of formula O—$T^1$—Z where $T^1$ represents a carbonyl group, a sulphinyl group or a sulphonyl group, or (b) a group of the formula O—X(Z)—O— where X represents a group —P(O)—; wherein Z represents an alkyl, alkenyl, alkynyl, cycloalkyl, aryl, heteroaryl, non-aromatic heterocyclic, aralkyl or heteroaralkyl group, wherein the functionalized polymeric substance has the property that it is developer insoluble prior to delivery of infrared radiation and developer soluble thereafter, and the functional groups Q do not comprise a naphthoquinone diazide or a benzoquinone diazide group.

32. A functionalised polymeric substance as claimed in claim 31, wherein $T^1$ represents a sulphonyl or carbonyl group and Z represents a phenyl or naphthyl group optionally substituted by a dialkylamino or alkyl group; or wherein Z represents a thienyl group or a $C_{2-8}$ alkyl group.

33. A positive working composition, comprising a functionalised polymeric substance as claimed in claim 31, in admixture with a compound comprising diazide moieties.

34. A method of making a polymeric substance as claimed in claim 31, comprising reacting together the said corresponding unfunctionalised polymeric substance with a compound or compounds supplying the said functional groups.

35. A method of making a polymeric substance as claimed in claim 31, comprising reacting together a monomer or a prepolymer, in either case not having the said functional groups thereon, with a compound supplying the said functional groups, to make a functionalised monomer or prepolymer, and polymerising said functionalised monomer or prepolymer, to make the functionalised polymeric substance.

36. A functionalised polymeric substance having functional groups Q thereon, such that the functionalized polymeric substance has the property that it is developer insoluble prior to delivery of infrared radiation and developer soluble thereafter, wherein the functional groups Q do not comprise a naphthoquinone diazide or a benzoquinone diazide group and the functionalised polymeric substance additionally carries diazide groups as separate functional groups to the functional groups Q, wherein the functionalised polymeric substance is used in a positive working composition for use in a method for producing a predetermined resist pattern on a substrate, the method comprising: the patternwise application of infrared radiation to a precursor which comprises the substrate, having a coating thereon, the coating comprising the positive working composition; and the development of the pattern using a developer.

37. A functionalised polymeric substance carrying a plurality of functional groups Q, wherein Q represents a group of formula O—$T^1$—Z where $T^1$ represents a carbonyl group, a sulphinyl group or a sulphonyl group, or a group of the formula O—X(Z)—O— where X represents a group —P(O)—; wherein Z represents an alkyl, alkenyl, alkynyl, cycloalkyl, aryl, heteroaryl, non-aromatic heterocyclic, aralkyl or heteroaralkyl group, each such group being substituted; wherein substituents of the aryl and heteroaryl groups, and of the aryl and heteroaryl parts of the alkyl or heteroaralkyl groups, are selected from halo, nitro, cyano, hydroxy, thiol, amino, substituted mono-$C_{14}$ alkylamino, substituted di-$C_{14}$ alkylamino, amido, substituted mono-($C_{14}$ alkyl)amido, substituted di-($C_{14}$ alkyl)amido, substituted $C_{2-4}$ alkenyl, substituted $C_{1-4}$ alkyl, substituted $C_{1-4}$ alkoxy, ($C_{1-4}$ alkyl)carbonylamino, —COOH, substituted ($C_{1-4}$ alkyl)carbonyl and substituted ($C_{1-4}$ alkoxy)carbonyl groups; and wherein substituents of the alkyl, alkenyl, alkynyl, cycloalkyl and non-aromatic heterocyclic groups, and of the alkyl parts of the aralkyl and heteroaralkyl groups, and of the alkyl, alkoxy, alkylamino, alkylamido, alkylcarbonyl, alkoxycarbonyl, alkylcarbonylamino and alkenyl moieties substituting said aryl or heteroaryl moieties are selected the group consisting of halo, nitro, cyano, carbonyl, hydroxy, thiol, amino, mono-$C_{14}$ alkylamino, di-$C_{14}$ alkylamino, amido, mono-($C_{14}$ alkyl)amido, di-($C_{14}$ alkyl)amido, $C_{1-4}$ alkoxy, —COOH, ($C_{1-4}$ alkyl) carbonylamino, ($C_{1-4}$ alkyl)carbonyl and ($C_{1-4}$ alkoxy) carbonyl groups, wherein the functionalized polymeric substance has the property that it is developer insoluble prior to delivery of infrared radiation and developer soluble thereafter, and the functional groups Q do not comprise a naphthoquinone diazide or a benzoquinone diazide group.

* * * * *